(12) United States Patent
Feng et al.

(10) Patent No.: US 9,461,581 B2
(45) Date of Patent: Oct. 4, 2016

(54) SHADOWING COMPENSATION DEVICE FOR SOLAR CELL MODULE

(71) Applicant: ABLEREX ELECTRONICS CO., LTD., New Taipei (TW)

(72) Inventors: Ya-Tsung Feng, Kaohsiung (TW); Jia-Min Shen, Kaohsiung (TW); Wen-Jie Hou, Kaohsiung (TW)

(73) Assignee: Ablerex Electronics Co., Ltd., New Taipei (TW)

( * ) Notice: Subject to any disclaimer, the term of this patent is extended or adjusted under 35 U.S.C. 154(b) by 61 days.

(21) Appl. No.: 14/072,875

(22) Filed: Nov. 6, 2013

(65) Prior Publication Data

US 2015/0122312 A1  May 7, 2015

(51) Int. Cl.
| | |
|---|---|
| *H02M 3/335* | (2006.01) |
| *G01R 31/40* | (2014.01) |
| *H01L 31/02* | (2006.01) |
| *H02J 3/38* | (2006.01) |
| *H02M 1/00* | (2006.01) |

(52) U.S. Cl.
CPC ......... *H02S 50/00* (2013.01); *H01L 31/02021* (2013.01); *H02J 3/383* (2013.01); *H02M 3/335* (2013.01); *H02M 3/33507* (2013.01); *H02M 3/33538* (2013.01); *H02M 2001/0093* (2013.01); *Y02E 10/563* (2013.01)

(58) Field of Classification Search
CPC .......... H02M 3/335; H02M 3/33507; H02M 3/33538
See application file for complete search history.

(56) References Cited

U.S. PATENT DOCUMENTS

| | | | |
|---|---|---|---|
| 2009/0303703 A1* | 12/2009 | Kao et al. | 362/183 |
| 2010/0001587 A1* | 1/2010 | Casey et al. | 307/80 |
| 2011/0031816 A1* | 2/2011 | Buthker et al. | 307/82 |
| 2012/0091800 A1* | 4/2012 | Shenoy et al. | 307/24 |
| 2012/0098344 A1* | 4/2012 | Bergveld et al. | 307/65 |

FOREIGN PATENT DOCUMENTS

CN          103066888 A          4/2013

* cited by examiner

*Primary Examiner* — Timothy J Dole
*Assistant Examiner* — Ishrat Jamali
(74) *Attorney, Agent, or Firm* — Alan D. Kamrath; Kamrath IP Lawfirm, P.A.

(57) ABSTRACT

A shadowing compensation device for a solar cell module has an input port, an isolated DC-DC power converter, and an output port. The input port is connected to two output ends of a solar cell array including multiple solar cell modules connected in series. The output port is connected to one of the multiple solar cell modules of the solar cell array. When one of the solar cell modules connected to the output port of shadowing compensation device has been shaded, the isolated DC-DC power converter outputs a compensating current to the solar cell module that has been shaded for increasing the output voltage of the solar cell module that has been shaded, and increasing the output voltage and output power of the solar cell array.

5 Claims, 5 Drawing Sheets

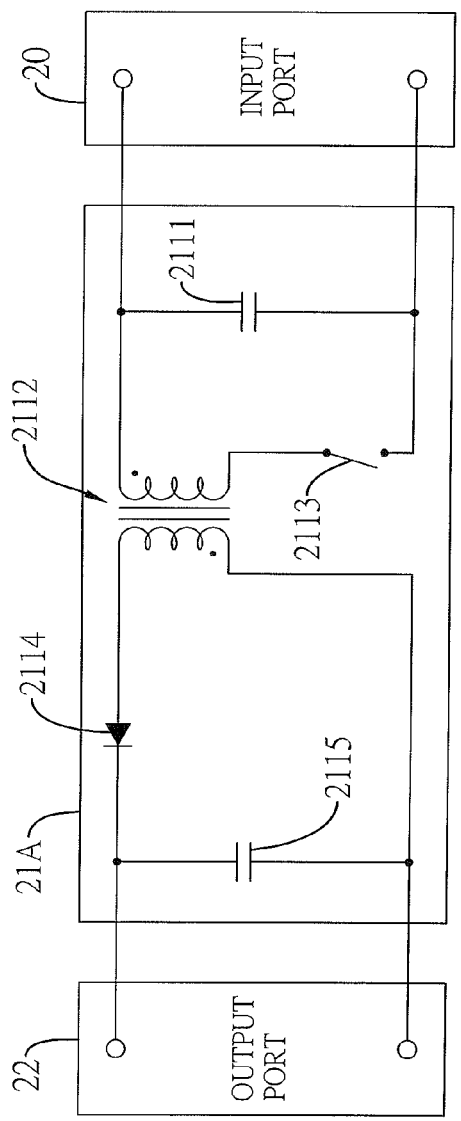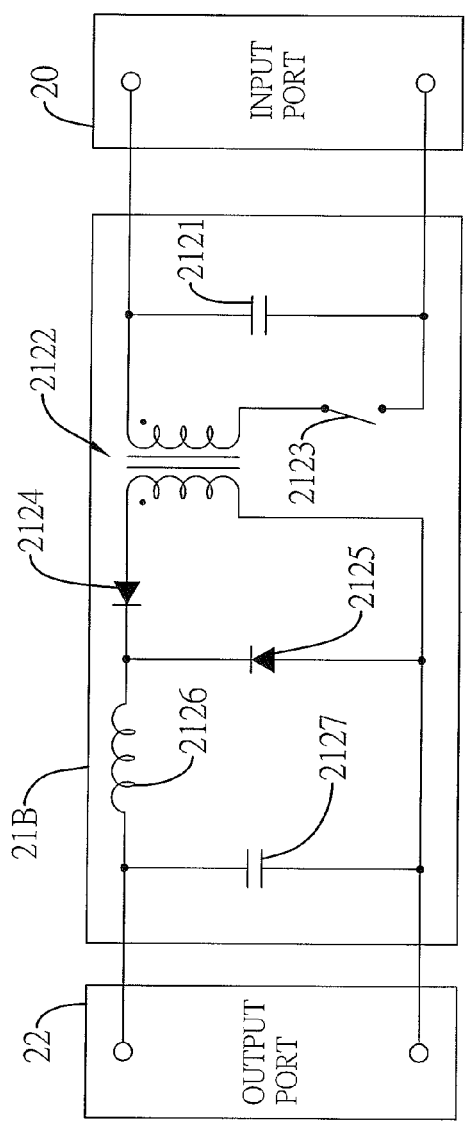

SHADOWING COMPENSATION DEVICE FOR SOLAR CELL MODULE

BACKGROUND OF THE INVENTION

1. Field of the Invention

The present invention relates to a shadowing compensation device for a solar cell module and, more particularly, to a shadowing compensation device that outputs a compensation current to a shaded solar cell module of a solar cell array, thereby improving an output voltage and output power of the entire solar cell array.

2. Description of the Prior Art

A solar cell array is comprised of multiple solar cell modules connected in series. When setting up the solar cell array on buildings, the solar cell array may be installed on a roof or a top floor. However, the circumstances may have water tanks, parapet walls, roof ventilators, etc. around the solar cell array. It may result in a shadow, such that one or more solar cell modules will be shaded. Since the solar cell modules are mounted at designated positions, the specific solar cell module possibly being shaded may be known beforehand. In other words, some specific solar cell modules in the solar cell array may encounter the shadow problem.

When the solar cell module has been completely or partially shaded, the shaded solar cell module may reduce its output current. If a total output current of the whole solar cell array is controlled to be larger than the output current of the shaded solar cell module, the shaded solar cell module can no longer generate energy, and turns to be a load. Thus, the shaded solar cell module will overheat and eventually cause damage.

To prevent the shaded solar cell module from causing damage, each solar cell module will be connected with one or more inversed diodes in parallel during packaging processes of the solar cell module. When the solar cell module has been shaded, the diode is conducted to clamp a voltage across the shaded solar cell module to about 0 volt. Since the shaded solar cell module stops providing the output power, the solar cell array will decrease its total output voltage and the total output power. Multiple peak points will appear on the P-V (power-voltage) curve that shows relationships between the maximum output power (P) and the total output voltage (V) of the solar cell array, and will cause great complexity in tracking the maximum output power of the solar cell array.

With reference to FIG. 1, a conventional voltage balancing circuit for the solar cell array is proposed to deal with the problem of unequal voltage resulting from the shaded solar cell module. The voltage balancing circuit is connected to all solar cell modules PV1-PV4 for controlling their voltages to be equal. When any one of the solar cell modules is shaded, the shaded solar cell module can still sustain its output voltage and provide partial power. Thus, the total output power of the whole solar cell array remains regular.

For a solar cell array comprised of n number of solar cell modules, the voltage balancing circuit needs an inductor, n capacitors, (n+1)×2 diodes, and n×2 power switches. For example, the solar cell array shown in FIG. 1 has four solar cell modules PV1-PV4 (n=4), and therefore the voltage balancing circuit should have an inductor L, four capacitors C1-C4, ten diodes D1-D10, and eight power switches S1-S8. As the number of solar cell modules increases, the corresponding capacitors, power switches and diodes of the voltage balancing circuit will proportionally increase in number, which causes relatively expensive cost and complicated circuit connections. Because the power switches S1-S8 are alternately switching at high frequency when any one of the solar cell modules is shaded, the efficiency will deteriorate.

With reference to FIG. 2A, another conventional way for solving the problems of shadowing is shown. Four solar cell modules PV1-PV4 are connected in series as a solar cell array. Each solar cell module PV1-PV4 has two output terminals connected to a respective input terminal of a DC-DC power converter 41. Output terminals of the four DC-DC power converters 41 are connected in sequence and then further connected to input terminals of a power converter 42. Each DC-DC power converter 41 controls the output voltage of the respective solar cell module PV1-PV4. When any one of the solar cell modules PV1-PV4 is shaded, the shaded solar cell module can still provide partial output power to improve the total output power of the solar cell array.

With reference to FIG. 2B, each DC-DC power converter 41 needs two capacitors C1-C2, five power switches S1-S5, an inductor L and a diode D1. The capacitor C1 is parallel connected to the output of a solar cell module. The diode D1 is parallel connected to the output terminal of DC-DC power converter 41. If a solar cell array consists of n solar cell modules accompanied with DC-DC power converters, such large number of elements will cause the problems of high cost and complicated circuit connections.

The present invention thus develops a shadowing compensation device for a solar cell module to mitigate or solve the problems mentioned above.

SUMMARY OF THE INVENTION

The main objective of the present invention is to provide a shadowing compensation device with features of relatively simple circuit configuration, easy control and low cost for compensating a shaded solar cell module of a solar cell array, thereby increasing the total output voltage and the total output power of the solar cell array.

The shadowing compensation device comprises an input port, an output port and an isolated DC-DC power converter. The input port is for connecting to two output ends of the solar cell array. The output port is for connecting to one of the solar cell modules of the solar cell array. When the solar cell module connected to the output port has been shaded, the isolated DC-DC power converter draws a part of energy of the solar cell array and converts the energy to a compensation current for compensating the solar cell module being shaded. Therefore, the solar cell module being shaded is able to sustain its output voltage and continuously output power to ensure the total output voltage and the total output power of the solar cell array. In short, the present invention at least has the following advantages.

1. Because the shadowing compensation device is only connected to the solar cell module that will be shaded, not connected to all of the solar cell modules of the solar cell array, the circuit connection and circuit control are simplified, and high system reliability is obtained.

2. The conventional way for dealing with the problems of shadowing needs to manage the total output power of the solar cell array. In contrast with the conventional way, the shadowing compensation device of the present invention is only connected to the solar cell module that will be shaded. When the solar cell module is shaded, the shadowing compensation device only processes a relative small power of the shaded solar cell module, such that its manage power is reduced. Therefore, the power loss of the shadowing compensation device is reduced as much as possible.

3. The shadowing compensation device is operated only when the solar cell module is shaded. When there is no solar cell module being shaded, the non-operated shadowing compensation device will not affect the solar cell array to ensure a high power converting efficiency.

Other objectives, advantages and novel features of the invention will become more apparent from the following detailed description when taken in conjunction with the accompanying drawings.

BRIEF DESCRIPTION OF THE DRAWINGS

FIG. 4 is a first embodiment of the shadowing compensation device in accordance with the present invention; and FIG. 5 is a second embodiment of the shadowing compensation device in accordance with the present invention.

DETAILED DESCRIPTION OF THE PREFERRED EMBODIMENTS

Figure 1:
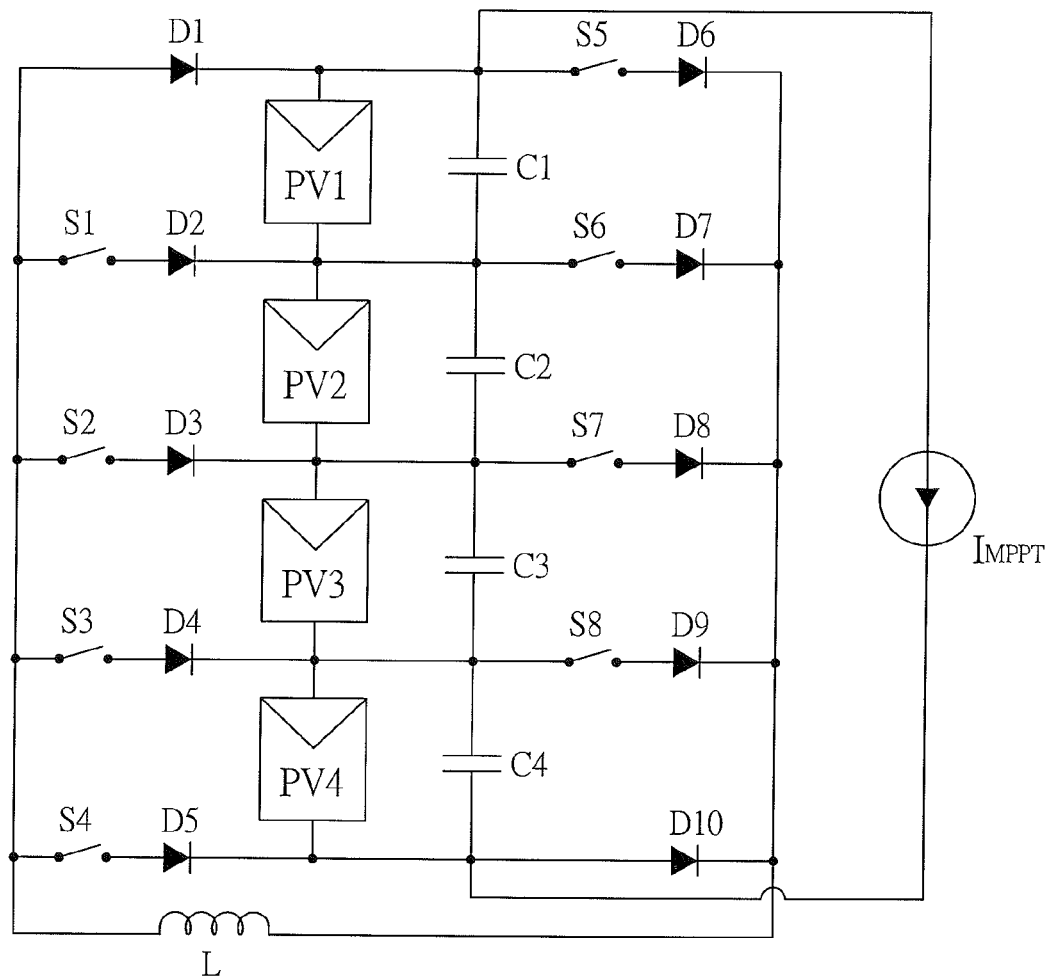
FIG. 1 shows a conventional voltage balancing circuit for a solar cell array.
Figure 2A:
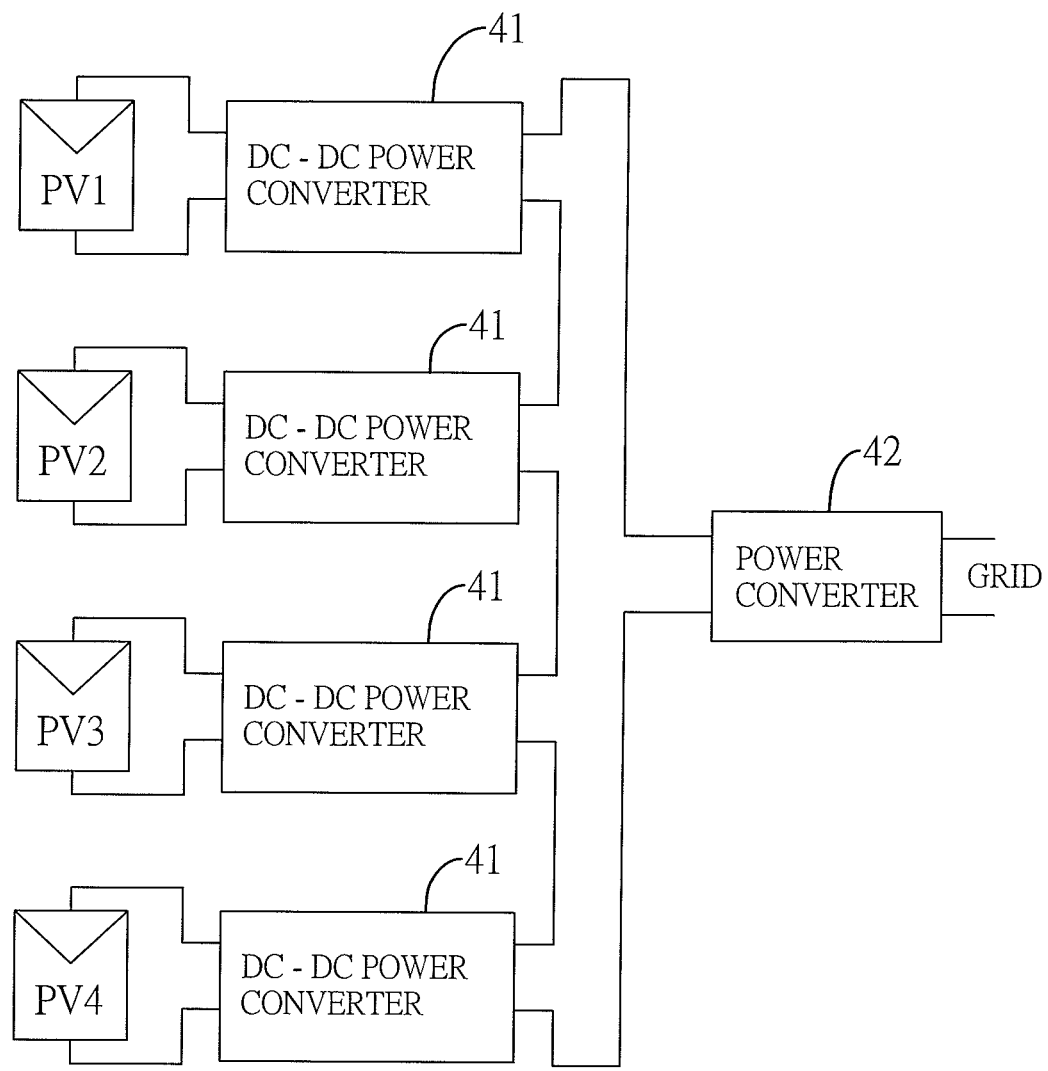
FIG. 2A is a circuit block diagram showing a conventional way for solving the problems of shadowing.
Figure 2B:
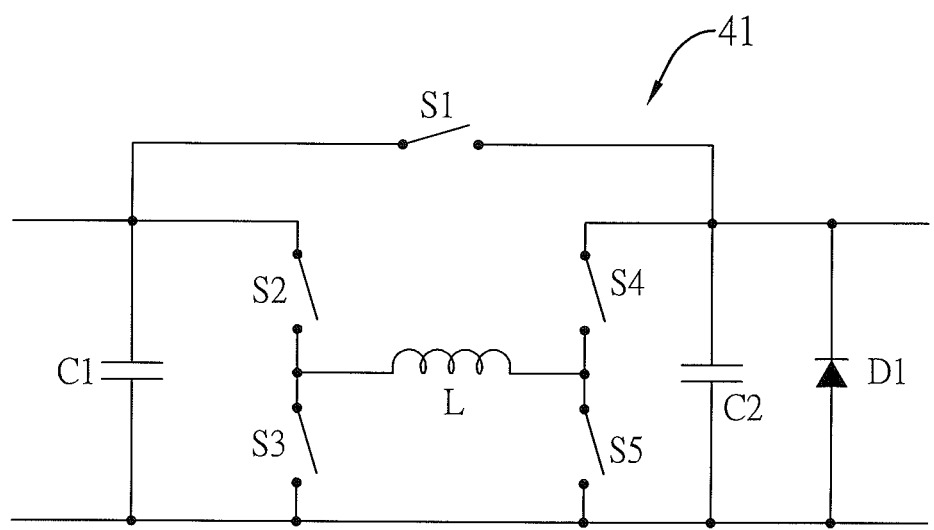
FIG. 2B is a detailed circuit diagram of the DC-DC power converters in FIG. 2A.
Figure 3:
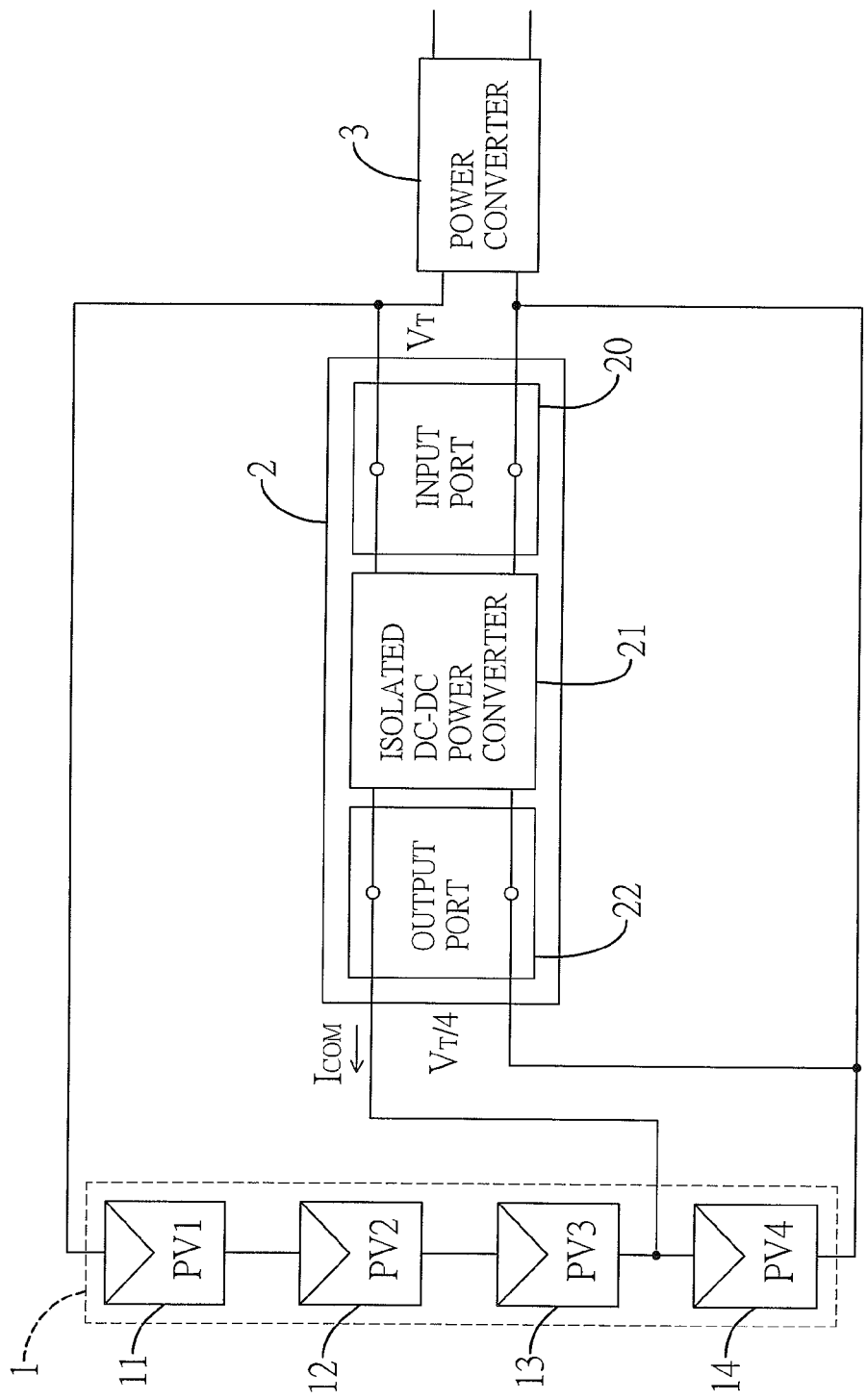
FIG. 3 is a block circuit diagram of a shadowing compensation device in accordance with the present invention applied to a solar cell array.

With reference to FIG. 3, a shadowing compensation device 2 of the present invention is applied to a solar power generating system that includes a solar cell array 1 and a power converter 3. The shadowing compensation device 2 comprises an input port 20, an isolated DC-DC power converter 21, and an output port 22.

The solar cell array 1 comprises multiple solar cell modules 11-14 connected in series and forms two output ends. In this embodiment, the solar cell array 1 comprises four solar cell modules 11-14 of the same type. Thus, the output voltages and the output powers of the solar cell modules 11-14 are substantially equal to each other under the same environmental conditions. A sum of the four output voltages of the four solar cell modules 11-14 is defined as a total output voltage $V_T$ of the solar cell array 1 across the two output ends.

The input port 20 and output port 22 of the shadowing compensation device 2 have two connecting nodes respectively as shown in FIG. 3. The two connecting nodes of the input port 20 are connected to the two output ends of the solar cell array 1 respectively. Any one of the solar cell modules 11-14 may be shaded. For demonstration purpose, the solar cell module 14 is supposed to be completely or partially shaded. Therefore, the two connecting nodes of the output port 22 have to be connected across the two ends of the solar cell module 14. The power converter 3 may be a DC-DC power converter to control the total output voltage VT and perform a maximum power tracking to the solar cell array 1.

Still referring to FIG. 3, the shadowing compensation device 2 will not work as long as no solar cell module is shaded. Therefore, the shadowing compensation device 2 will not cause additional energy loss. When the solar cell module 14 is shaded, the shadowing compensation device 2 operates. The shaded solar cell module 14 will slightly change its maximum-power voltage $V_{MPP}$, but will significantly reduce its maximum-power current $I_{MPP}$. The extent of the reduction of the maximum-power current $I_{MPP}$ depends on the shaded degree of the solar cell module 14.

The shadowing compensation device 2 has a voltage gain 1/n, wherein "n" is the number of the solar cell modules of the solar cell array 1. For the solar cell array 1 shown in FIG. 3, n=4. With such a voltage gain, the output voltage of the shaded solar cell module 14 approximates the output voltage of each solar cell module 11-13 unshaded. By applying the shadowing compensation device 2 to the solar power generating system, the shadowing compensation device 2 supplies a compensation current $I_{COM}$ to the shaded solar cell module 14. Therefore, the output voltage of the shaded solar cell module 14 can be maintained as close to its maximum-power voltage $V_{MPP}$ as possible. Thereby, the shaded solar cell module 14 remains at its regular output current for continuously supplying power.

If the solar power generating system works alone without using the shadowing compensation device 2 of the present invention, the following problems may occur. Since the output current of each unshaded solar cell module 11-13 operated at the maximum-power voltage is larger than the output current of the shaded solar cell module 14, a diode connected across the shaded solar cell module 14 is turned on to clamp the output voltage of the shaded solar cell module 14 to about 0 volt. The shaded solar cell module 14 stops supplying the output power. The total output voltage and the total output power of the solar cell array 1 are decreased. The P-V curve showing relationships between the maximum output power (P) and the total output voltage (V) of the solar cell array 1 will have multiple peak points. Multiple peak points increase difficulties in tracking the maximum output power.

However, the shadowing compensation device 2 of the present invention draws a part of energy from the two output ends of the solar cell array 1 to supply the compensation current $I_{COM}$ to the shaded solar cell module 14. The compensation current $I_{COM}$ is equal to a difference between the output current of the shaded solar cell module 14 and the output current of each unshaded solar cell module 11-13 operated at the maximum output power.

The shadowing compensation device 2 is operated only when the solar cell module 14 has been shaded. The shadowing compensation device 2 supplies a compensation power $P_{COM}$ approximating to a product of the compensation current $I_{COM}$ and one fourth of the total output voltage ($V_T$) of the solar cell array 1, i.e. $P_{COM}=(V_T/4) \times I_{COM}$. The amount of the compensation power $P_{COM}$ depends on the shaded degree of the solar cell module 14, but it is smaller than or equal to one fourth of the total output power of the solar cell array 1. Therefore, the shadowing compensation device 2 with a small capacity can be accomplished, and the manage power for solving the problems of shadowing is also small as compared with the conventional way where it needs to manage the total output power of the whole solar cell array 1. In contrast with the conventional way, using the shadowing compensation device 2 of the present invention can reduce power loss. Since the shadowing compensation device 2 will not operate until the solar cell module 14 is shaded, the efficiency of the solar cell array 1 is almost unaffected by the shadowing compensation device 2.

Because the shadowing compensation device 2 is only connected to the solar cell module 14 that will be shaded, and is not connected to all of the solar cell modules 11-14, the circuit connection and control can be simplified to obtain high system reliability.

In the situation that multiple solar cell modules will be shaded, multiple shadowing compensation devices 2 should be applied to these solar cell modules, respectively. The input port 20 of each shadowing compensation device 2 is connected to the two output ends of the solar cell array 1, and the output port 22 of each shadowing compensation device 2 is connected to the output terminals of the corresponding solar cell module that will be shaded.

With reference to FIG. 4, a first embodiment of the isolated DC-DC power converter 21 of the shadowing compensation device 2 is implemented by a flyback DC-DC power converter 21A. The flyback DC-DC power converter 21A comprises an input capacitor 2111, a transformer 2112 with two sides, a power switch 2113, a diode 2114 and an output capacitor 2115. The transformer 2112 transfers DC power from one side into the other side. The power switch 2113 is connected between the transformer 2112 and the input port 20. The diode 2114 is connected between the transformer 2112 and the output port (22). The input capacitor 2111 is connected to the input port 20, and the output capacitor 2115 is connected to the output port 22.

With reference to FIG. 5, a second embodiment of the isolated DC-DC power converter 21 of the shadowing compensation device 2 is implemented by a forward DC-DC power converter 21B. The forward DC-DC power converter 21B comprises an input capacitor 2121, a transformer 2122, a power switch 2123, a diode 2124, a diode 2125, an inductor 2126 and an output capacitor 2127. The input capacitor 2121 is connected to the input port 20, and the output capacitor 2127 is connected to the output port 22.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A solar cell system with shadowing compensation comprising: a solar cell array comprising multiple solar cell modules connected in series to form two output ends, with the multiple solar cell modules comprising a single first solar cell module and multiple second solar cell modules; and a single shadowing compensation device only connected to the first solar cell module but not the multiple second cell modules comprising: an input port connecting to the two output ends of the solar cell array; an output port only connecting to the single first solar cell module of the solar cell array without connecting to the multiple second solar cell modules of the solar cell array; and an isolated DC-DC power converter, wherein the isolated DC-DC power converter outputs a compensation current to the single first solar cell module connected to the output port; wherein each of the second solar cell modules is not connected to any respective shadowing compensation device wherein the compensation current is equal to a difference between an output current of the multiple second solar cell modules operated at a maximum output power and an output current of the first solar cell module.

2. The solar cell system as claimed in claim 1, wherein the isolated DC-DC power converter is a flyback DC-DC power converter.

3. The solar cell system as claimed in claim 1, wherein the isolated DC-DC power converter is a forward DC-DC power converter.

4. The solar cell system as claimed in claim 1, wherein the isolated DC-DC power converter is operated only when the single first solar cell module connected to the output port is completely or partially shaded.

5. A solar cell system with shadowing compensation comprising: a solar cell array comprising multiple solar cell modules connected in series to form two output ends, with the multiple solar cell modules comprising a single first solar cell module and multiple second solar cell modules; and a single shadowing compensation device only connected to the first solar cell module but not the multiple second cell modules comprising: an input port connecting to the two output ends of the solar cell array; an output port only connecting to the single first solar cell module of the solar cell array without connecting to the multiple second solar cell modules of the solar cell array; and an isolated DC-DC power converter, wherein the isolated DC-DC power converter outputs a compensation current to the single first solar cell module connected to the output port;

wherein the shadowing compensation device has a voltage gain $1/n$, n is a total number of the first solar cell module and the second solar modules of the solar cell array, each of the second solar cell modules is not connected to any respective shadowing compensation device and wherein the compensation current is equal to a difference between an output current of the multiple second solar cell modules operated at a maximum output power and an output current of the first solar cell module.

\* \* \* \* \*